(12) United States Patent
Ye et al.

(10) Patent No.: US 11,309,208 B2
(45) Date of Patent: Apr. 19, 2022

(54) ELECTROSTATIC CHUCK AND METHOD FOR MANUFACTURING PROTRUSIONS THEREOF

(71) Applicant: BEIJING NAURA MICROELECTRONICS EQUIPMENT CO., LTD., Beijing (CN)

(72) Inventors: Hua Ye, Beijing (CN); Quanyu Shi, Beijing (CN); Hougong Wang, Beijing (CN); Jinguo Zheng, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 17/040,888

(22) PCT Filed: Mar. 28, 2019

(86) PCT No.: PCT/CN2019/080031
§ 371 (c)(1),
(2) Date: Sep. 23, 2020

(87) PCT Pub. No.: WO2019/184968
PCT Pub. Date: Oct. 3, 2019

(65) Prior Publication Data
US 2021/0005496 A1    Jan. 7, 2021

(30) Foreign Application Priority Data

Mar. 29, 2018 (CN) .......................... 201810271475.2

(51) Int. Cl.
*H01L 21/683* (2006.01)
(52) U.S. Cl.
CPC ................ *H01L 21/6833* (2013.01)

(58) Field of Classification Search
CPC ........... H01L 21/6833; H01L 21/68757; H01L 21/6831; H01L 21/67103
(Continued)

(56) References Cited

U.S. PATENT DOCUMENTS

| 5,583,736 A | 12/1996 | Anderson et al. |
| 6,423,193 B1 * | 7/2002 | Miller ................... C25B 11/073 204/242 |

(Continued)

FOREIGN PATENT DOCUMENTS

| CN | 1727410 A | 2/2006 |
| CN | 101393883 A | 3/2009 |

(Continued)

OTHER PUBLICATIONS

World Inteli Fctual Property Organization (WIPO) International Search Report for PCT/CN2019/080031 dated Jun. 28, 2019 5 Pages.

*Primary Examiner* — Kevin J Comber
(74) *Attorney, Agent, or Firm* — Anova Law Group, PLLC

(57) ABSTRACT

The present disclosure provides an electrostatic chuck (ESC) and a method for manufacturing the plurality of protrusions of the ESC. The electrostatic chuck includes a support surface for carrying a workpiece and the plurality of protrusions distributed at intervals on the support surface. The protrusions are formed by a hydrogen-free amorphous carbon with a resistivity ranging from $10^{-4}$ $\Omega\cdot cm \sim 10^{9} \Omega\cdot cm$. For the ESC provided by the present disclosure, the protrusions are formed by the hydrogen-free amorphous carbon and have a high hardness and a good wear resistance, which may effectively prevent a generation of particles. As such, the negative impact of the particles on the semiconductor process may be avoided, and the hydrogen does not dissociate in a high-temperature environment. Thereby, a problem (Continued)

that the protrusions may easily fall off and may not be suitable in the high-temperature environment (above 250° C.) may be solved.

6 Claims, 6 Drawing Sheets

(58) Field of Classification Search
USPC ......................................................... 361/234
See application file for complete search history.

(56) References Cited

U.S. PATENT DOCUMENTS

| 2003/0047283 | A1  | 3/2003 | Parkhe et al. |
| 2005/0183669 | A1* | 8/2005 | Parkhe .................. C23C 16/463 |
|              |     |        |                              118/724 |
| 2017/0140970 | A1* | 5/2017 | Boyd, Jr. ............ H01L 21/6875 |
| 2020/0292947 | A1* | 9/2020 | Poiesz ................ H01L 21/6875 |

FOREIGN PATENT DOCUMENTS

| CN | 102002683  | A | 4/2011 |
| CN | 107154376  | A | 9/2017 |
| CN | 108538776  | A | 9/2018 |
| JP | 2001517872 | A | 10/2001 |

\* cited by examiner

ELECTROSTATIC CHUCK AND METHOD FOR MANUFACTURING PROTRUSIONS THEREOF

CROSS-REFERENCES TO RELATED APPLICATIONS

This application is a national phase entry under 35 U.S.C. § 371 of International Application No. PCT/CN2019/080031, filed on Mar. 28, 2019, which claims priority of Chinese patent application No. 201810271475.2, filed with the State Intellectual Property Office of P. R. China on Mar. 29, 2018, the entire contents of both of which are incorporated herein by reference in their entirety.

TECHNICAL FIELD

The present disclosure generally relates to the field of semiconductor processing equipment field and, in particular, to a manufacturing method for an electrostatic chuck and protrusions on the electrostatic chuck.

BACKGROUND

In the semiconductor manufacturing process, an electrostatic chuck (ESC) uses electrostatic adsorption to fix a to-be-processed workpiece, for example, a wafer, to prevent the wafer from moving in the manufacturing process.

The ESC generally includes a dielectric layer carrying the wafer. One or more electrodes are embedded in the dielectric layer. For example, a bipolar electrostatic chuck may include two electrodes, which are electrically connected to positive and negative poles of a DC power supply to provide a DC voltage, respectively. As such, the wafer is firmly attached on the surface of the ESC by electrostatic adsorption.

However, such close contact between the wafer and the ESC may cause friction between the wafer and the ESC to produce small particles. As manufacturing time gradually accumulates, the number of the particles may increase, and a large number of particles may be attached to the back surface of the wafer. Then, the particles may be transferred to different chambers as the process steps progress to negatively impact the semiconductor manufacturing process.

To avoid the above-described situation, a plurality of protrusions at intervals may be formed on the surface of the ESC. As such, the wafer may only contact the ESC through the protrusions on the back surface to reduce the number of the particles attached to the back surface of the wafer. However, the existing protrusions have poor high-temperature resistance and are prone to fall off, thus, they cannot be used in a high-temperature environment.

SUMMARY

For a technical problem in the existing technology, the present disclosure provides an electrostatic chuck (ESC). The ESC includes a support surface for carrying a workpiece and a plurality of protrusions at intervals distributed on the support surface. The protrusions are formed by hydrogen-free amorphous carbon with a resistivity ranging from $10^{-4}$ $\Omega \cdot cm$ to $10^9 \Omega \cdot cm$.

In particular, a height of a protrusion ranges from 1 μm~3 μm.

In particular, the ESC further includes an adhesive layer. The adhesive layer includes a plurality of adhesive parts having the same number as the number of the protrusions. Each of the adhesive parts is placed between the support surface and a corresponding one of the protrusions.

In particular, a material of the adhesive layer includes a metal having an adhesive property.

In particular, the metal includes titanium or chromium.

In particular, the ESC further includes a dielectric layer and an electrode provided in the dielectric layer. An upper surface of the dielectric layer is used as the support surface.

The present disclosure further provides a method for manufacturing the protrusions of the ESC, which includes the following processes.

At S1, a patterned mask is formed over the support surface of the ESC for carrying the workpiece.

At S2, a carbon plasma is generated by using a graphite target, and a hydrogen-free amorphous carbon layer is deposited over the support surface of both the area that is covered by the mask and the area that is not covered by the mask.

At S3, the mask is removed to form the plurality of protrusions with the hydrogen-free amorphous carbon having the resistivity ranging from $10^{-4}$ $\Omega \cdot cm$~$10^9 \Omega \cdot cm$ distributed at intervals over the support surface.

In particular, after the process S1 and before the process S2, the method further includes the following processes.

At S12, one or more adhesive layers are deposited over the support surface of both the area that is covered by the mask and the area that is not covered by the mask.

At S2, the graphite target is used to generate the carbon plasma, and the hydrogen-free amorphous carbon layer is deposited over the whole adhesive layer.

At S3, the mask is removed to form the plurality of adhesive parts distributed at intervals over the support surface and the plurality of protrusions each provided at a corresponding one of the plurality of adhesive parts.

In particular, the adhesive layer includes a metal such as titanium or chromium.

In particular, at S2, the process temperature is not higher than 80° C.

In particular, S2 further includes the following processes,

At S21, the carbon plasma is generated by using the graphite target.

At S22, when the carbon plasma moves towards the support surface, and the hydrogen-free amorphous carbon layer is deposited over the support surface that is covered by the mask and not covered by the mask, the carbon plasma is filtered and/or focused using a magnetic field.

In particular, the height of the protrusion ranges from 1 μm~3 μm.

DETAILED DESCRIPTION

Figure 1:
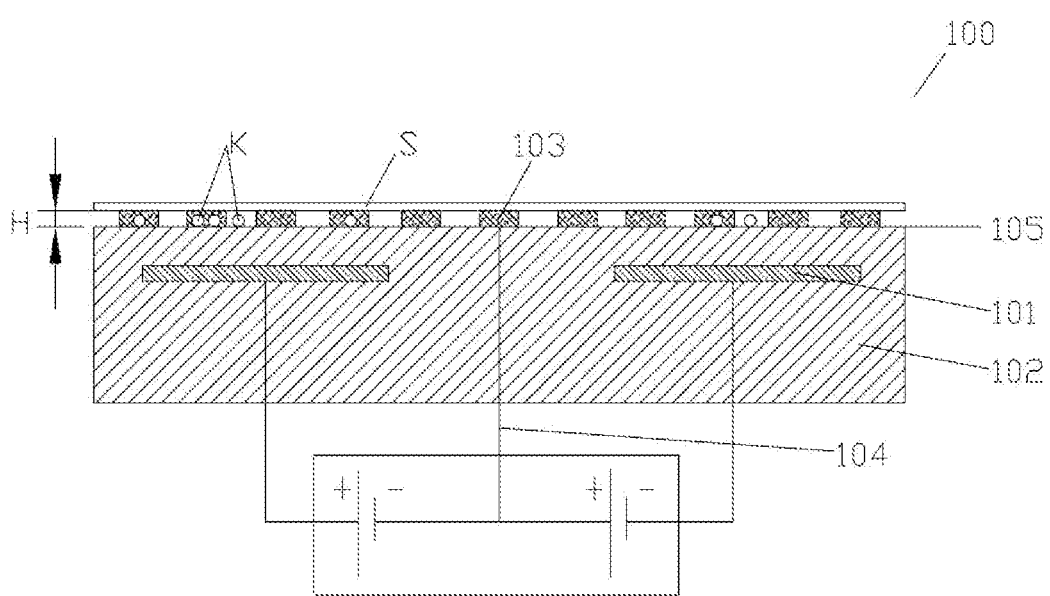
FIG. 1 is a schematic cross-section diagram of an electrostatic chuck (ESC) according to some embodiments of the present disclosure.

To make purposes, technical solutions, and advantages of the present disclosure clearer, the present disclosure is further described in detail below in conjunction with embodiments and with reference to drawings. It should be noted that the description is merely illustrative, but does not necessarily limit the scope of the present disclosure. In the following specification, a description of a well-known structure and technology are omitted to avoid unnecessarily obscuring concepts of the present disclosure.

In the following detailed description, reference drawings may be used to describe some specific embodiments of the present disclosure. In the reference drawings, similar reference numerals may describe substantially similar components in different drawings. Each specific embodiment of the present application is described in detail below, so that those of ordinary skill with relevant knowledge and technology in the art can implement a technical solution of the present disclosure. It should be understood that other embodiments may also be used or structural, logical, or electrical changes may be made to embodiments of the present disclosure.

FIG. 1 is a schematic cross-section diagram of an electrostatic chuck (ESC) according to some embodiments of the present disclosure. As shown in FIG. 1, the ESC includes a dielectric layer 102 and an electrode 101 provided in the dielectric layer 102. An upper surface of the dielectric layer 102 is used as a support surface 105 to carry a workpiece S, such as a wafer, etc. In some embodiments, the dielectric layer 102 may be formed by a ceramic material, such as aluminum oxide ($Al_2O_3$), aluminum nitride (AlN), and silicon carbide (SiC), or the dielectric layer 102 may be formed by a conductive material, such as a metal-oxide-doped ceramic material, etc.

In some embodiments, two electrodes 101 may be embedded in the dielectric layer 102, that is, the dielectric layer 102 may completely cover the electrodes 101. In addition, the two electrodes 101 may be coupled to positive and negative poles of a DC power supply, respectively. Of course, the present disclosure may also be suitable to an ESC including a different number of electrodes, for example, one or more than three electrodes.

As shown in FIG. 1, a plurality of protrusions 103 are distributed on the support surface 105 (i.e., the upper surface of the dielectric layer 102) at intervals. When the workpiece S is placed on the dielectric layer 102, a back surface of the workpiece S contacts the plurality of protrusions 103 but does not contact the support surface 105. As such, a number of particles generated by friction between the workpiece S and the dielectric layer 102 may be reduced. At the same time, since the generated particles K in gaps between each of the protrusions 103, as long as height H of the protrusions 103 is larger than sizes of the particles K, the particles K may be ensured not to contact and be attached to the back surface of the workpiece S.

Further, the protrusions 103 are formed by hydrogen-free amorphous carbon with the resistivity ranging from $10^{-4}$ $\Omega\cdot cm \sim 10^9 \Omega\cdot cm$. The hydrogen-free amorphous carbon is a diamond-like-carbon (DLC). The DLC is composed of carbon and is similar to diamond in structure and properties. The DLC is called diamond-like carbon because the DLC includes both an SP3 bond composing the diamond and an SP2 bound composing graphite. Content of the SP3 bond reaches about 85%, thus, the DLC has a higher hardness than other materials. The DLC is an amorphous substance. Since the DLC has a high hardness, high elastic modulus, and a low friction coefficient, the DLC has good wear resistance and vacuum tribological properties, and is very suitable as a wear-resistant coating. For the ESC, since the DLC material has high hardness and good wear resistance, the DLC can effectively prevent the generation of the particles.

In addition, the DLC includes two types: hydrogen-containing and hydrogen-free. The hydrogen-containing DLC is called hydrogen-containing amorphous carbon (a-C:H) or hydrogen-containing diamond-like carbon (DLHC). The hydrogen-free DLC is called hydrogen-free amorphous carbon (a-C). Further, the a-C with a higher carbon content doped with SP3 bond is also called tetrahedral amorphous carbon (ta-C). The hydrogen-containing DLC has a poor temperature resistance. The hydrogen of the DLC may dissociate and easily fall off in the high-temperature environment. Therefore, the hydrogen-containing DLC is not suitable in a high-temperature environment (above 250° C.).

To solve the above-described problem, the ESC provided by embodiments of the present disclosure may use the protrusions 103 formed by the hydrogen-free amorphous carbon having the resistivity ranging from $10^{-4}$ $\Omega\cdot cm \sim 10^9 \Omega\cdot cm$. Therefore, the protrusions 103 have a high hardness and good wear resistance and can effectively prevent the generation of the particles. As such, the protrusions 103 may prevent the particles to bring the negative impact to the semiconductor process. Thus, the hydrogen may not dissociate in a high-temperature condition. Thereby, the problem that the protrusions may easily fall off and cannot be applied in the high-temperature environment (above 250° C.) may be solved.

The protrusions 103 formed with the hydrogen-free amorphous carbon may not have any property change in a vacuum environment with 800° C. Even in an atmospheric environment, the highest resistant temperature of the protrusions formed with the hydrogen-free amorphous carbon may reach 500° C. Therefore, the ESC including the protrusions made of the hydrogen-free amorphous carbon may satisfy a requirement of high-temperature stability.

In some embodiments, the above-described protrusions 103 are formed by the tetrahedral amorphous carbon (ta-C), which is an optimal choice for the protrusions of the electrostatic chuck due to its high hardness.

In practical applications, to draw a voltage of workpiece S as a reference, the protrusions are expected to be conductive. As shown in FIG. 1, the potential of the workpiece S may be led to a neutral point of the DC power supply through the conductive protrusion 103 and a wire 104 to balance the voltage difference between the power supply and the workpiece S. However, the protrusions in the existing technology may generally have a higher resistivity (i.e., $10^8 \Omega\cdot cm$ $10^{13} \Omega\cdot cm$), and electrical conductivity of the protrusions may not meet the above requirement.

Since the resistivity of a protrusion 103 ranges from $10^{-4}$ $\Omega\cdot cm \sim 10^9 \Omega\cdot cm$, the electrical conductivity of the protrusion 103 may meet the requirement. As such, the above-described problem may be solved.

In some embodiments, the height H of the protrusion 103 ranges from 1 μm~3 μm. Thus, the height of the protrusion 103 is larger than the size of the particle. Thereby, the particles may not be attached to the back surface of the workpiece S.

It needs to be noted that, in practical applications, an orthographic projection shape of the protrusion 103 on the support surface 105 and the size of the protrusion 103 may be freely set as needed. In addition, a distribution method and distribution density of the plurality of protrusions 103 on the support surface 105 may also be freely set as needed.

Figure 2:
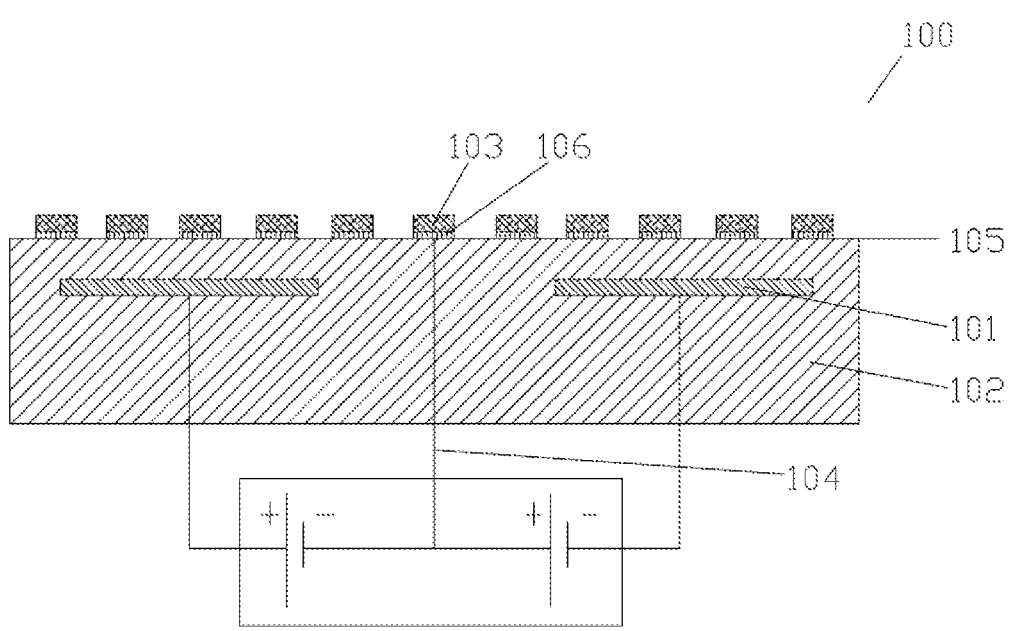
FIG. 2 is a schematic cross-section diagram of an ESC according to some embodiments of the present disclosure.

FIG. 2 is a schematic cross-section diagram of an ESC 100 according to some embodiments of the present disclosure. Referring to FIG. 2, the ESC 100 provided by embodiments of the present disclosure is optimized based on the above-described embodiments. Specifically, the ESC 100 further includes at least one adhesive layer. The adhesive layer includes a plurality of adhesive parts 105 having a same number as a plurality of protrusions 103. Each of the adhesive parts 106 is provided between the support surface 105 and a corresponding one of the plurality of protrusions 103.

With the above-described adhesive layer, the adhesive property between the protrusions 103 and the dielectric layer 102 may be improved, such that a risk that the protrusions 103 may fall off may be further reduced. In practical applications, a number of the adhesive layer may be set according to actual needs to cause the adhesion to meet the requirement.

A material of the adhesive layer may include a metal having an adhesive property. In some embodiments, the metal may include a material having a better adhesive property such as titanium or chromium.

Figure 3:
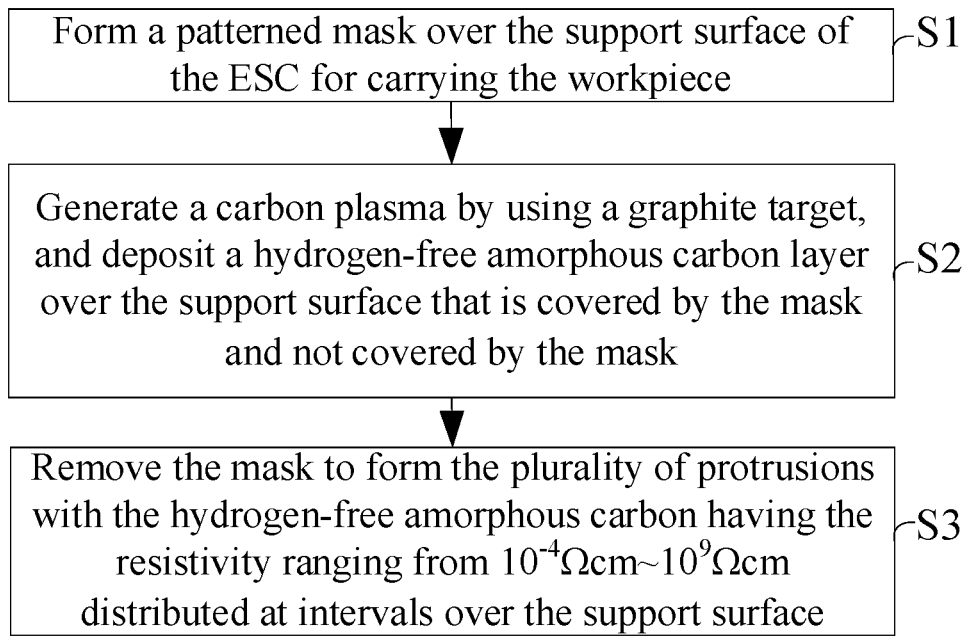
FIG. 3 is a schematic flowchart of a method for manufacturing the plurality of protrusions of the ESC according to some embodiments of the present disclosure.

For another technical solution, FIG. 3 is a schematic flowchart of a method for manufacturing the protrusions of the ESC according to some embodiments of the present disclosure. FIGS. 4a-4f are state diagrams of each step of the method for manufacturing the protrusions of the ESC according to some embodiments of the present disclosure. Referring to FIG. 3 and FIGS. 4a-4f, embodiments of the present disclosure provide a method for manufacturing the protrusions of the ESC, which includes the following processes.

At S1, a patterned mask is formed over the support surface 202 of the ESC (i.e., dielectric layer 201).

Figure 4A:
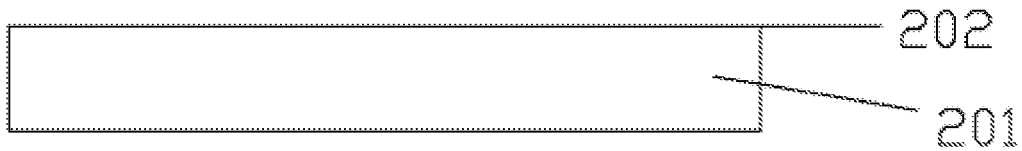
FIGS. 4a-4f are state diagrams of each step of the method for manufacturing the protrusions of the ESC according to some embodiments of the present disclosure.
Figure 4B:
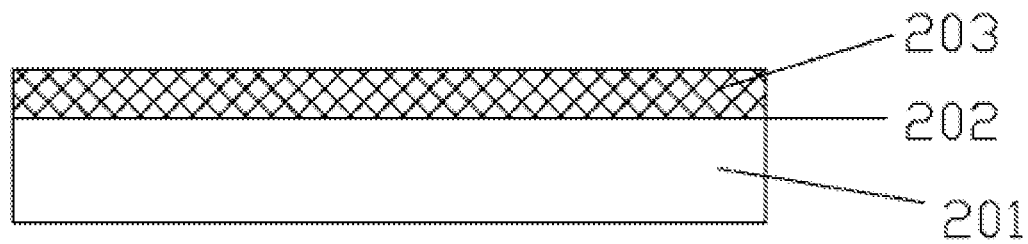
Figure 4C:
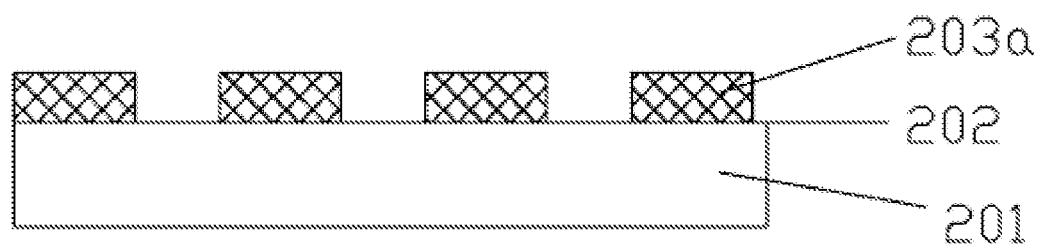

Specifically, in some embodiments, as shown in FIG. 4b, a mask layer 203 is formed over the support surface 202. The mask layer 203 covers the support surface 202. A material of the mask layer 203 may include a photoresist, etc. A thickness of the mask layer 203 may be thicker than or equal to the height of the protrusions that need to be formed. As shown in FIG. 4c, the mask layer 203 may be patterned according to the shape and intervals of the protrusions that need to be realized to form a patterned mask 203a.

It needs to be noted that, in practical applications, the patterned mask may be prepared by other methods. For example, the patterned mask may be a mask panel pre-prepared before the ESC is prepared. The mask panel may be fixed over the support surface 202 through an adhesive or mechanical method. In addition, the mask panel may include a plurality of hollow portions. Each hollow portion corresponds to a protrusion. A shape of the hollow portion, an interval of two adjacent hollow portions, and the thickness of the mask panel, etc., may be designed according to actual parameter requirements of the protrusions. The height of the protrusion may be also related to deposition time.

In some embodiments, the mask panel may be prepared by using a ceramic material with a relatively low thermal expansion coefficient. When the hydrogen-free amorphous carbon is formed by technology with relatively low deposition temperature, the material of the mask panel may include the ceramic or metal material with a relatively low thermal expansion coefficient, such as KOVAR, etc.

Of course, no matter which method is used to obtain the patterned mask, the following described process for forming the protrusions is not impacted.

Figure 4D:
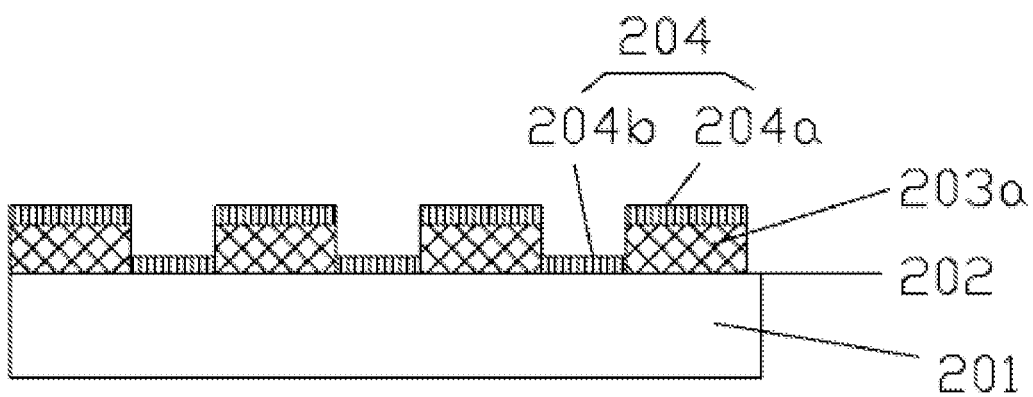

In some embodiments, as shown in FIG. 4d, after the above-described process S1 and before the process for forming the protrusions, the method further includes the following processes.

At S12, at least one adhesive layer 204 is deposited over the support surface 202 of both the area that is covered by the patterned mask 203a and the area that is not covered by the patterned mask 203a.

Specifically, the adhesive layer 204 includes a first portion 204a covering the mask 203a and a second portion 204b covering the support surface 202.

With the above-described adhesive layer 204, the adhesive property between the protrusions and the dielectric layer 201 may be improved for subsequently forming the protrusions, such that the risk that the protrusions may fall off may be further reduced. In practical applications, the number of adhesive layers may be set according to the actual needs to meet the adhesion requirement.

A material of the adhesive layer 204 includes a metal with the adhesive property. In some embodiments, the metal includes a material with good adhesive property, such as titanium or chromium.

Of course, in practical applications, even though the adhesive layer 204 does not exist, the protrusions may be formed directly over the patterned mask 203a.

The manufacturing process of the protrusions is described in detail as follows.

At S2, a carbon plasma is generated by using a graphite target, and a hydrogen-free amorphous carbon layer is deposited over the adhesive layer 204.

Figure 4E:
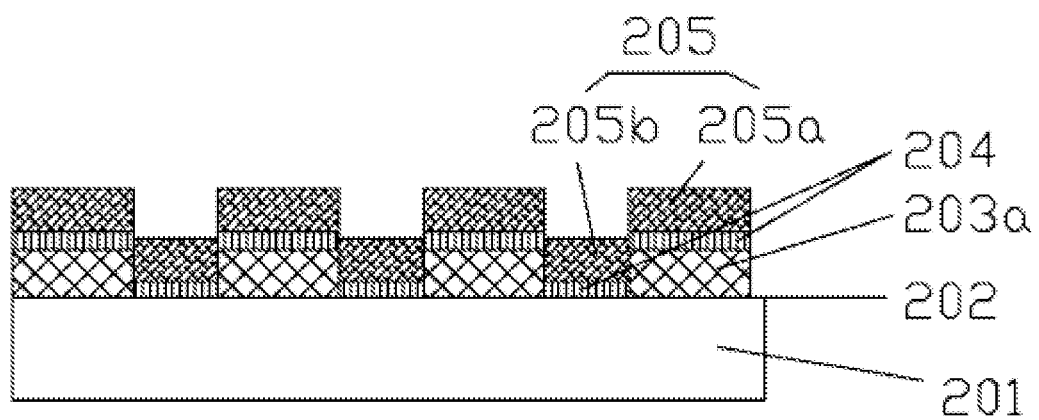

Specifically, as shown in FIG. 4e, the hydrogen-free amorphous carbon layer 205 includes a third portion 205a covering the first portion 204a of the adhesive layer 204 and a fourth portion 205b covering the second portion 204b of the adhesive layer 204. Of course, in practical applications, if the adhesive layer 204 does not exist, the hydrogen-free amorphous carbon layer 205 may directly cover the support surface 202 that is covered by the mask 203a and not covered by the mask 203a.

The method for manufacturing the protrusions provided by embodiments of the present disclosure may obtain the hydrogen-free DLC through a deposition method by generating the carbon plasma using the graphite target. As such, the problem that the protrusions may easily fall off due to the dissociation of the hydrogen and may not be applied in the high-temperature environment (above 250° C.) may be solved.

In some embodiments, in the above-described process S2, the process temperature for depositing the hydrogen-free amorphous carbon layer 205 is lower than 80° C. or even lower.

Figure 4F:
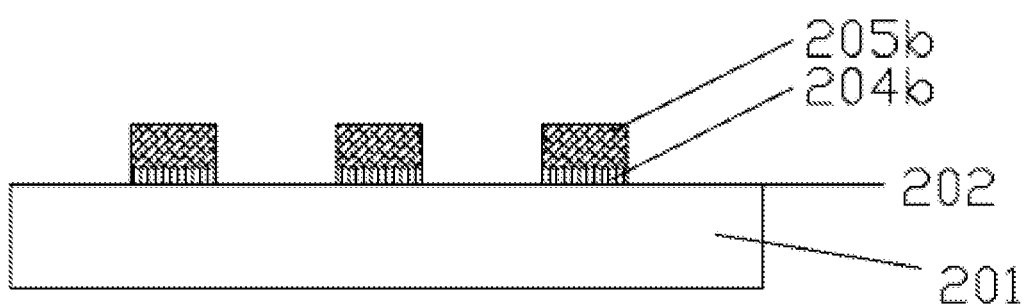

At S3, as shown in FIG. 4f, the mask 203a is removed to form the plurality of adhesive parts (i.e., the second portion 204b of the adhesive layer 204) distributed at intervals on the support surface 202, and the plurality of protrusions (i.e., the fourth portion 205b of the hydrogen-free amorphous carbon layer 205) each provided on a corresponding one of the plurality of adhesive parts. It can be easily understood that the third portion 205a of the hydrogen-free amorphous carbon layer 205 and the first portion 204a of the adhesive layer 204 over the mask 203a are removed with the mask 203a together.

Of course, in practical applications, if the adhesive layer 204 does not exist, after the mask 203a is removed, the plurality of protrusions (i.e., the fourth portion 205b of the hydrogen-free amorphous carbon 205) may be formed directly on the support surface 202 and distributed at intervals.

It needs to be noted that if the patterned mask 203a is the above-described mask panel, the patterned mask 203a may be directly removed through a mechanical method. If the patterned mask 203a is a photoresist layer grown over the dielectric layer 201, the photoresist layer may be removed by a developing operation, and the third portion 205a of the hydrogen-free amorphous carbon layer 205 and the first portion 204a of the adhesion layer 204 over the photoresist layer may be peeled off. Since a developing solution is usually an organic solution, the developing solution may not impact the adhesive layer 204 and the hydrogen-free amorphous carbon layer 205.

In some embodiments, the height of the protrusion may range from 1 μm~3 μm. As such, the heights of the protrusions 103 may be ensured to be larger than the sizes of the particles. Therefore, the particles may be ensured not to be able to contact and be attached to the back surface of the workpiece S. In practical applications, the heights of the protrusions may be adjusted by controlling the deposition time.

Figure 5:
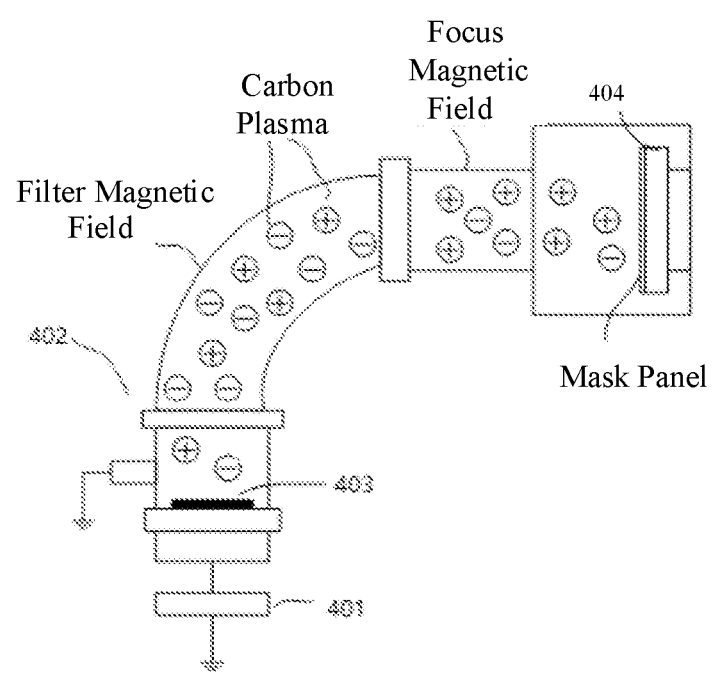
FIG. 5 is a schematic diagram of equipment for manufacturing the protrusions of the ESC according to some embodiments of the present disclosure.

FIG. 5 is a schematic diagram of equipment for manufacturing the protrusions of the ESC according to some embodiments of the present disclosure. Referring to FIG. 5, the equipment uses a filtered cathodic vacuum arc (FCVA) technology to form the protrusions. Specifically, the equipment may include a power supply 401, a chamber 402, a graphite target 403 placed in the chamber 402, and the ESC 404. In some embodiments, the power supply 401 may be, for example, an arc power supply.

With the equipment, the above-described process S2 further includes the following processes.

At S21, the arc power supply 401 is used to cause the graphite target 403 in a first region of the chamber 402 to generate the carbon plasma through an electrical arc.

The above-described equipment may accurately control the energy of the carbon plasma according to different process requirements. At the same time, the resistivity of the protrusions may be well controlled by using the above-described FCVA process. As such, the conductivity of the protrusions 103 may be caused to meet the requirements.

At S22, when the carbon plasma moves toward the support surface, and the hydrogen-free amorphous carbon layer is deposited, the carbon plasma is filtered and/or focused by a magnetic field.

Specifically, a filter magnetic field is provided in a second region of the chamber 402 and is configured to filter macroparticles and atomic groups in the carbon plasma out. After such a magnetic filtering process, an ionization rate of ions used for deposition may reach as high as 100%, and large particles may be filtered out. As such, without heating the ESC, after the interaction of the magnetic field, FCVA coating ions may have higher and more uniform energy, such that a dense, high-hardness, low-resistivity, and super-adhesive layer may be formed under a low-temperature condition.

In addition, a focus magnetic field may be provided in a third region of the chamber 402 and may be configured to gather the ions after filtering to the ESC 404. As such, the hydrogen-free amorphous carbon layer 205 may be deposited over the adhesive layer 204 or the support surface 202 to finally form the protrusions.

In some embodiments, the above-described adhesive layer 204 may be formed using the FCVA technology and the equipment. Specifically, forming the adhesive layer 204 includes the following processes.

At S121, a material target of the adhesive layer 204 is provided in the first region of the chamber 402, such as a chromium target. Before forming the hydrogen-free amorphous carbon layer 205, the material target of the adhesive layer may be first rotated to a position corresponding to the chamber 402. Then, the FCVA method similar for forming the hydrogen-free amorphous carbon layer 205 is used to first deposit a patterned adhesive layer over the support surface 201. Then the material target may be replaced, and the processes S21 and S22 may continue to be performed.

In some embodiments, the thickness of the patterned adhesive layer ranges from 100 nm~3 μm. In this range, the total height of the adhesive layer and the protrusion may range from 2 μm~6 μm.

In some embodiments, the process temperature for depositing the hydrogen-free amorphous carbon layer 205 and the adhesive layer 204 is lower than 80° C. or even lower. As such, the mask panel made of a metal material may be used to form the protrusions and the adhesive layer. The cost of the metal material is usually lower than the ceramic material. Therefore, the manufacturing cost may be significantly reduced for forming the protrusions using the FCVA method.

It needs to be noted that the present disclosure is not limited by using the FCVA method to form the hydrogen-free amorphous carbon layer 205. In practical applications, a physical vapor deposition (PVD) method may also be used to form the hydrogen-free amorphous carbon layer 205, for example, a plasma deposition method, a radio frequency sputtering method, and a vacuum cathodic arc deposition method, etc.

Only a high purity carbon target may be needed by using the PVD method to form the protrusions without needing any material having hydrogen element. Therefore, the protrusions made of the hydrogen-free amorphous carbon, which does not contain hydrogen and has good conductivity, may also be obtained.

The above-described embodiments are merely used to describe the present disclosure but not limit the present disclosure. Those of ordinary skill in the art may make various modifications and changes without departing from the scope of the present disclosure. Therefore, all the equivalent technical solutions should be within the scope of the present disclosure.

What is claimed is:

1. A method for manufacturing an electrostatic chuck, comprising:

forming a dielectric layer wrapping around an electrode of the electrostatic chuck;

forming a patterned mask over the dielectric layer;

generating a carbon plasma from a graphite target in a chamber and depositing a hydrogen-free amorphous carbon layer over the dielectric layer at a deposition temperature of less than or equal to about 80° C.; and removing the patterned mask to form hydrogen-free amorphous carbon protrusions, wherein the hydrogen-free amorphous carbon protrusions have a resistivity ranging from $10^{-4}\Omega\cdot cm$~$10^{9}\Omega\cdot cm$ to avoid hydrogen dissociation and fall off the hydrogen-free amorphous carbon protrusions, and wherein generating the carbon plasma from the graphite target and depositing the hydrogen-free amorphous carbon layer include:

placing the graphite target in a first region of the chamber, applying an electrical arc to cause the graphite target in the first region of the chamber to generate the carbon plasma, applying a filter magnetic field in a second region of the chamber to filter out macroparticles and atomic groups from the carbon plasma, and applying a focus magnetic field in a third region of the chamber to move the filtered carbon plasma onto a surface of the dielectric layer of the electrostatic chuck.

2. The method of claim 1, further comprising:

after forming the patterned mask and before depositing the hydrogen-free amorphous carbon layer, depositing an adhesive layer over the patterned mask, followed by depositing the hydrogen-free amorphous carbon layer over the adhesive layer;

wherein removing the patterned mask includes forming adhesive parts on the dielectric layer, each adhesive part being under one of the hydrogen-free amorphous carbon protrusions.

3. The method of claim 2, wherein a material of the adhesive layer includes a metal, the metal including titanium or chromium.

4. The method of claim 1, wherein a height of the hydrogen-free amorphous carbon protrusion ranges from 1 μm~3 μm.

5. The method according to claim 1, wherein the electrostatic chuck comprises:

a support surface provided by the dielectric layer for carrying a workpiece; and adhesive parts on the support surface of the dielectric layer, wherein the hydrogen-free amorphous carbon protrusions are formed on the adhesive parts in a one-to-one correspondence.

6. The method according to claim 5, wherein further comprising:

determining a height of the hydrogen-free amorphous carbon protrusions based on a size of particles generated by friction between the workpiece and the dielectric layer, such that the generated particles are confined on the support surface and between adjacent protrusions without touching a surface of the workpiece.

* * * * *